United States Patent [19]
Yamanouchi

[11] 4,404,673
[45] Sep. 13, 1983

[54] ERROR CORRECTING NETWORK

[75] Inventor: Roy K. Yamanouchi, San Jose, Calif.

[73] Assignee: National Semiconductor Corporation, Santa Clara, Calif.

[21] Appl. No.: 232,786

[22] Filed: Feb. 9, 1981

[51] Int. Cl.³ .................... G06F 11/10; G11C 29/00
[52] U.S. Cl. ........................................ 371/13; 371/38
[58] Field of Search .................................. 371/13, 38

[56] References Cited

U.S. PATENT DOCUMENTS

| | | | |
|---|---|---|---|
| 3,582,880 | 6/1971 | Beausoleil | 371/13 |
| 4,037,091 | 7/1977 | Beuscher | 371/13 |
| 4,216,541 | 8/1980 | Clover et al. | 371/38 |
| 4,319,356 | 3/1982 | Kocol et al. | 371/38 |

OTHER PUBLICATIONS

P. W. Woo, Error Correction Upon Digital Transmission from a Digital Recording Device, IBM Tech. Discl. Bulletin, vol. 9, No. 9, Feb. 1967, pp. 1107-1109.
Gourneau and Hinkel, Error Correction as an Extension of Error Recovery on Information Strings, IBM Tech. Discl. Bulletin, vol. 24, No. 1B, Jun. 1981, pp. 651-652.

Primary Examiner—Charles E. Atkinson
Attorney, Agent, or Firm—Gail W. Woodward; Paul J. Winters; Neil B. Schulte

[57] ABSTRACT

An error correcting network adapted for encoding and decoding data transferred to and from a bubble memory has parallel linear encoder/decoder circuits. An error syndrome generated in response to a parity error in an initial read operation is used by one encoder/decoder circuit for correcting the parity error during a subsequent reread of the data. The error syndrome is also stored in a latch for comparison with a second error syndrome generated in response to the data during the reread operation. A true comparison between the two error syndromes verifies that that data has not changed between the two read operations due to a soft error and that the error correction of the first encoder/decoder circuit is valid.

8 Claims, 4 Drawing Figures

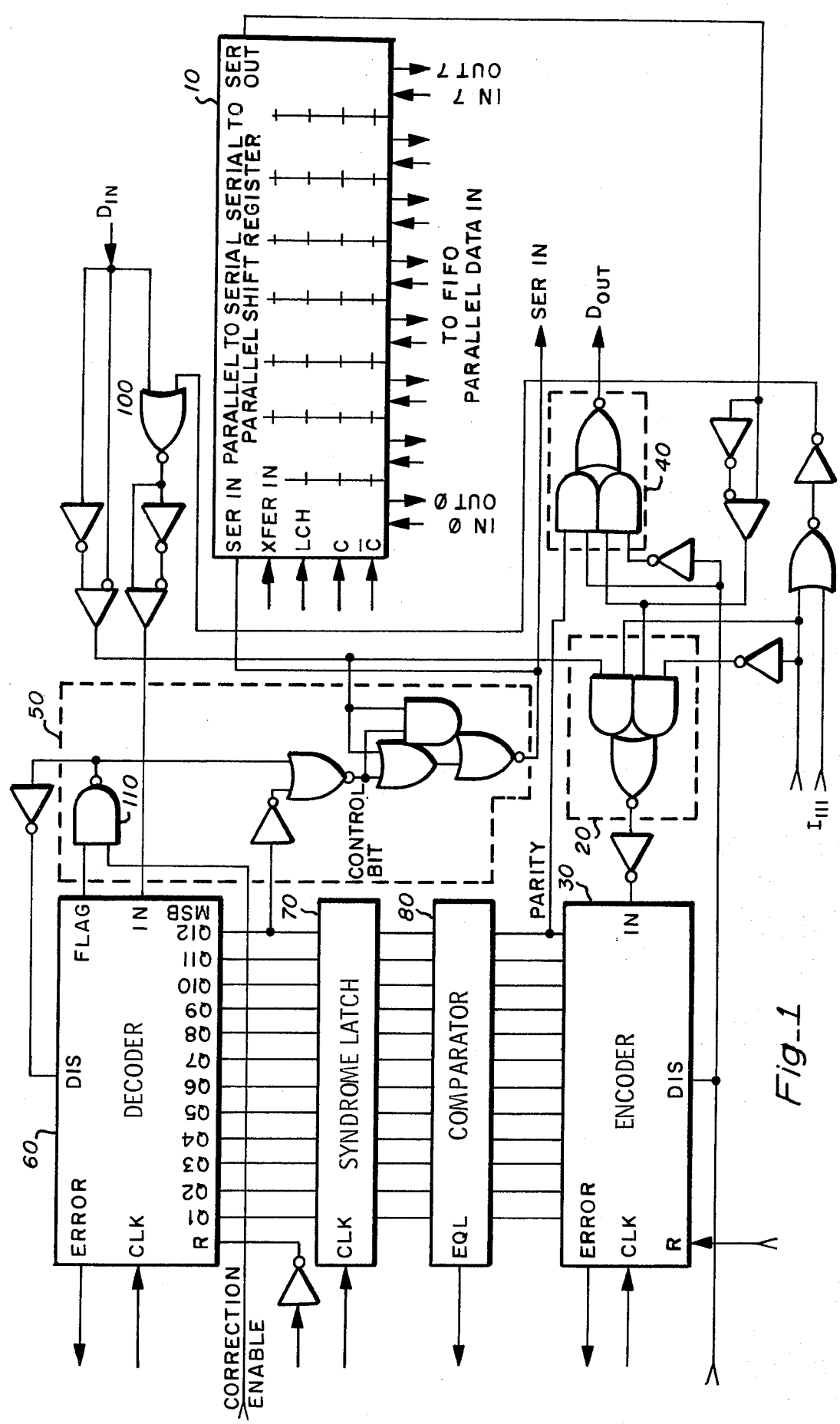
Fig_1

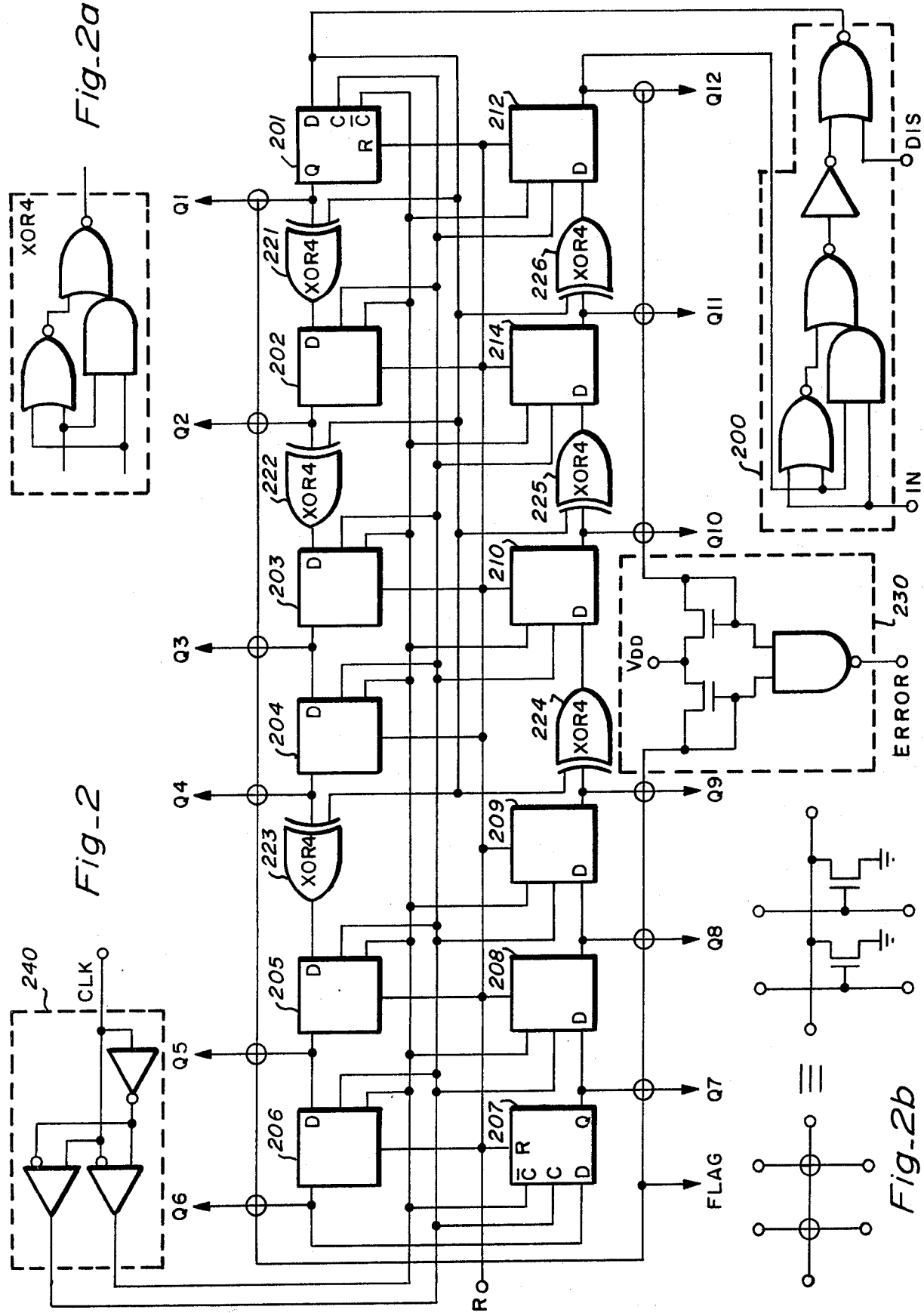

ERROR CORRECTING NETWORK

BACKGROUND OF THE INVENTION

1. Field of the Invention

The present invention relates generally to Error Correcting Codes and Error Correcting Networks for digital memories. More specifically, the present invention relates to coding and decoding circuitry using a shortened cyclic code adapted to correct data read from a bubble memory. A parity error is detected and located during an initial read operation, then corrected during subsequent reread operation. Further, the present circuitry identifies soft errors occurring during the read or reread operation by comparing an error syndrome associated with the original read operation to another error syndrome associated with the reread operation. This verifies the validity of the collected data. This verification is especially important in bubble memories, which are especially susceptible to soft errors.

2. Description of the Prior Art

In an Algebraic Error Correcting Code, a parity check is assigned to those positions in the code that have a one ("1") in the rightmost position of their binary representation, a second parity check for those positions that have one ("1") in their second to right position, etc. When a single error occurs, exactly those parity checks will fail for which the binary expansion of the location of the error has ones ("1s"). Thus, the pattern of parity-check failures points directly to the location of the error. Once an error is so identified, it is easy to change an erroneous bit to its complementary value during a reread operation and thus correct the error. A good discussion of error correcting codes can be find in *ERROR CORRECTING CODES*, (1961), W. W. Peterson, published by the MIT Press, Cambridge, Mass.

Conventional error correction circuitry does not correct transient errors. In bubble memories a predominate error source is transient (soft errors). This type of error is nonpermanent error and results in the data being read from memory varying from one read operation to the next. Conventional error correction networks using error correcting encoding techniques provide an "error syndrome" from and the parity bits which locates any parity errors and is used for correcting the errors in the data during a subsequent reread of the data from the memory. However, this technique assumes that the data read during the reread operation is identical to the data read during the initial read operation. Unfortunately, when this technique is used and a soft error occurs during the read or reread operation, undetected parity errors can be inserted by the error correction network. In another technique the initial data is saved and then corrected by the error correction network. This method does prevent the occurrence of a soft error occurring between read operations. However, this technique requires an undesirably large amount of RAM.

In addition to correcting hard errors and detecting soft errors occurring during the reread of the data block being corrected, it is desirable to detect parity errors in other data blocks associated with a page of data being reread. In addition to these correction and detection capabilities, it is desirable for the Error Correction Network used for encoding the data block for storage to be easily implemented. Further, it is desirable for the encoding hardware to be also useful in decoding of data read from memory and for detecting parity errors with little or no additional circuitry. Finally, the hardware used for encoding and decoding the code vectors should be easily modified to implement optional error correction.

BRIEF DESCRIPTION OF THE FIGURES

FIG. 1 is a detailed schematic diagram of an error correction network having two cyclic shaft register encoders (labeled encoder and decoder) in accordance with the preferred embodiment of the present invention.

FIGS. 2a and 2b are detailed schematic diagrams of a cyclic shift register as used in FIG. 1. Specifically, FIG. 2 is a detailed schematic of a FIRE code cyclic shift register.

SUMMARY OF THE INVENTION

An error correcting network adapted for encoding and decoding data transferred to and from a bubble memory has parallel linear encoder/decoder circuits. An error syndrome generated in response to a parity error in an initial read operation is used by one encoder/decoder circuit for correcting the parity error during a subsequent reread of the data. The error syndrome is also stored in a latch for comparison with a second error syndrome generated in response to the data during the reread operation. A true comparison between the two error syndromes verifies that that data has not changed between the two read operations due to a soft error and that the error correction of the first encoder/decoder circuit is valid.

In an alternative embodiment of the present invention, the data is also encoded in data blocks having associated parity bits. However, data is transferred in larger data segments, known as pages, having more than one block. During a reread operation in a first mode of operation, the second shift register is used to provide an error syndrome for comparison with the initial error syndrome. When the data block being corrected is reread in a second mode of operation, the first shift register is idle, storing the initial error syndrome of the to be corrected data block, and the second shift register is used to detect parity errors in the other data blocks being reread.

DETAILED DESCRIPTION OF THE INVENTION

Clock circuitry 240 provides complementary clock signals to the C and $\bar{C}$ clock inputs of the 12 flip-flops and the R terminal selectively provides a reset signal to the 12 flip-flops. The state of the shift register can be determined by sampling the data states of the twelve flip-flops provided on terminals Q1–Q12. Further, output terminals Q1–Q9 are logically combined as illustrated in FIG. 2c to provide a Flag signal in response to signals associated wth terminals Q1–Q9 all being "0"s. The signals on output terminals Q10–Q12 are logically combined with the flag signal to provide an Error signal.

In operation, the present embodiment of the preferred embodiment of the present invention can be operated in three modes. In a write mode, parallel digital data is encoded and stored with associated parity bits in a digital storage medium such as a bubble memory. Specifically, referring to FIG. 1, parallel digital data is applied to the inputs of shift register 10. Shift register 10 converts the data from a parallel to a serial format and applies the serialized data to one input of a Multiplexer 20. In the write mode of operation Multiplexer 20 couples this serial data to an input of an Encoder 30. Encoder 30 generates 12 parity bits which are applied to a first input of Multiplexer 40. The serial data from shift register 10 is applied to a second input of Multiplexer 40. Multiplexer 40 first couples the serial data on the second input to the $D_{OUT}$ terminal for storage in the bubble memory. After the 512 serial bits of a digital data block have been clocked to the $D_{OUT}$ terminal, encoder 30 is clocked 12 times and Multiplexer 40 couples the 12 parity bits on the second input provided by encoder 30 to the $D_{OUT}$ terminal for storage with the associated data bits.

In the read mode of operation, serial data and associated parity bits are read from the bubble memory into terminal $D_{IN}$. This data is coupled to an input of Error Correction Network 50 and passes unaltered to a serial input of shift register 10. Shift register 10 converts the serial data to a convenient parallel form. The serial data and the associated parity bits are also applied to an input of Decoder 60. Decoder 60 decodes the data block and the associated parity bits and determines whether a parity Error has occurred. In the event that a parity error is detected, an error signal is provided on an ERROR output of Decoder 60 and a non-zero error syndrome is generated by Decoder 60. This error syndrome is coupled to and stored by a Syndrome Latch 70.

In the event that an error is detected during a read operation, the user may do a "correct read" operation. In this mode of operation the data is reread from the bubble memory and corrected in response to the error syndrome generated during the initial read operation by Decoder 60. Specifically, the error syndrome identifies the exact location of the error in the initial read operation and the data can be corrected during the reread as follows. Decoder 60 stores the error syndrome associated with the data block to be corrected. Decoder 60 is further conditioned by setting the IN signal to Decoder 60 to a logical "0" by applying a logical "1" to the DISABLE INPUT terminal of NOR gate 100 and clocking the Decoder 111 times. This is a result of the shortened cyclic code associated with the Decoder having a cycle of 635 clocks as compared to the 524 bits size of a data block. Once the Decoder 60 has been preconditioned, the DISABLE INPUT signal is set a logical "0" and a correction enable signal applied to one input of AND gate 110 is set to a logical "1". Data is read from the bubble memory into input terminal $D_{IN}$ and coupled to both the input of Decoder 60 and the input of Error Correction Network 50.

In response to the input data and the preconditioning, Decoder 60 provides a signal on its Flag terminal in response to signals Q1–Q9 being all logical zeroes. The Flag signal is applied to the other input of AND gate 110, resulting in a disable signal being applied to the DIS input of Decoder 60. The 'Fire Code' algorithm predicts that the parity is now in one of the three bit locations associated with Q10, Q11, or Q12. Specifically, if the input of Decoder 60 is now disabled and clocked in sequence with the incoming data, the error location will be identified by the occurrence of a signal of the MSB (Q12) output of Decoder 60. Accordingly, the Flag and Q12 signals are coupled to the Error Correction Network to identify the error location. The Error Correction Network logically complements the bit identified as being in error before it is applied to the serial input of shift register 10.

The serial data read from the bubble memory is further applied to one input of Multiplexer 20. Multiplexer 20 couples the reread data to the input of Encoder 30 which is coupled to operate in one of two modes. In the first mode of operation, wherein Decoder 60 is correcting a data block during a reread operation, Encoder 30 produces an error syndrome associated with the reread data which is applied to Comparator 80. This provides a test to see if any soft errors have occurred between the initial read and the reread operations. If the error syndrome in the syndrome latch resulting from the initial read operation matches the error syndrome generated by Encoder 30 during the reread operation of the same data block, no soft errors have occurred and the data correction done by Decoder 60 presumed valid. However, if a data bit has changed between the read operations, the noncomparison determined by Comparator 80 identifies the occurrence of a soft error. This noncomparison indicates that the corrected data is not valid.

In a second mode of the reread operation the Error Correction Circuit is used to correct pages of data having more than one data block. In this case, while Decoder 60 is stored with an error syndrome associated with one of the data blocks in the page to be corrected, Encoder 30 is used to detect parity errors in the other blocks of the page as they are read during the reread operation.

DETAILED DESCRIPTION OF THE PREFERRED EMBODIMENT

The encoder and decoder of FIG. 1 are implemented as identical cyclic shift register as shown in detail in FIG. 2. These are 12 bit shift registers having predefined feedback paths. Serial data from input IN is exclusively OR'D (XOR'D) in circuitry 200 with the Q12 most significant bit ("MSB") data from a D type flip-flop 212. This XOR'D data is applied to the input of flip-flop 201 in response to a DIS signal. The data is serially propogated through flip-flops 202, 203, 204, 205, 206, 207, 208, 209, 210, 211 and back to 212. The input to flip-flop 201 is also "exclusively OR'D" with the "D" inputs of flip-flops 202, 203, 205, 210, 211 and 212 by XOR4 circuits 221, 222, 223, 224, 225 and 226 which are illustrated in further detail in schematic diagram FIG. 2a.

Conventionally, error correcting codes and the associated parity bits are implemented to encode blocks of data having a length of 512 bits. However, data is also typically read in and out of memory in much larger quantities referred to as pages. Specifically, each page of data comprises one half to eight 512 bit blocks of data. Each data block has 12 associated parity bits stored with it in memory. The preferred embodiment of the present invention corrects a single error in any data block and detects errors occurring in other blocks during a reread operation. Conventional error correcting networks having only one error correcting code shift register cannot detect errors in other blocks during a reread correction operation because the single shift register must store the error syndrome for the use in the correction of the erroneous block. Further, they do not provide a way of detecting a soft error in the data block being corrected.

While the invention has been particularly taught and described with reference to the preferred embodiment, those versed in the art will appreciate that minor modifications in form and detail may be made without departing from the scope of the invention. For instance, the preferred embodiment of the present invention has been described as a controller for bubble memory. However, the method and circuitry could be adapted for use with tape storage or any other digital storage medium without departing from the scope of the present invention. Accordingly, all such modifications embodied within the scope of this patent properly come within the contribution to the art particularly pointed out by the following claims.

I claim:

1. A method for verifying the integrity of error correction of digital data and associated parity bits read from a digital storage system comprising the steps of:
   reading the stored digital data and the associated parity bits;
   detecting a parity error in the digital data and the associated parity bits;
   generating an error syndrome associated with the digital data, the associated parity bits and the location of the parity error;
   storing the error syndrome;
   rereading the stored digital data and the associated parity bits;
   correcting the reread digital data in response to the error syndrome;
   generating a reread error syndrome associated with the reread digital data, the associated parity bits and the location of any errors occurring during the reread step; and
   comparing the stored error syndrome and the reread error syndrome.

2. A method as in claim 1 wherein the rereading of the stored digital data and the associated parity bits is from the digital storage system.

3. A method for correcting and verifying the integrity of error correction of a page of digital data divided into data blocks, each data block stored with associated parity bits in a digital storage system, comprising the steps of:
   reading the page of digital data and the associated parity bits;
   detecting a parity error in one of the data blocks and the associated parity bits;
   generating an error syndrome associated with the one data block, the associated parity bits and the location of the parity error in the one data block;
   storing the error syndrome;
   rereading the page of digital data blocks and the associated parity bits;
   correcting the one data block in response to the error syndrome;
   generating a reread error syndrome associated with the reread of the one data block, the associated parity bits and the location of any errors occurring during the reread step;
   comparing the stored error syndrome and the reread error syndrome; and
   detecting parity errors in the other data blocks during the reread step.

4. An error correction network for correcting errors and verifying the error correction in a block of digital data stored in an error correcting code format in a digital memory during a reread of the block of digital data in response to an initial error syndrome associated with the location of parity errors previously detected in the block of digital data, the network comprising:
   first error correcting code means coupled to the digital memory to receive the reread block of digital data and the associated parity bits and responsive to the initial error syndrome for correcting the previously detected parity error;
   a syndrome latch coupled to receive the initial error syndrome for storing the initial error syndrome generated during the initial read of the digital data;
   a second error correcting code means coupled to receive the reread digital data and the associated parity bits for producing another error syndrome associated with the reread digital data, the associated parity bits and the location of any parity errors; and
   a comparison circuit coupled to the syndrome latch and to the second error correcting code means for providing an output signal in response to the initial error syndrome comparing to the error syndrome associated with the reread block of digital data.

5. An error correction network as in claim 4 wherein the first and second error correcting code means each comprise shift registers having feedback loops for generating a cyclic error correcting code.

6. An error correction network as in claim 5 wherein the first and second error correcting code means generate FIRE codes.

7. An error correction network as in claim 4, 5 or 6 wherein the first error correcting code means is coupled to receive the digital data and the associated parity bits for producing the initial error syndrome in response to the initial read of the block of digital data and is further coupled to the syndrome latch for providing the error syndrome.

8. An error correction network as in claim 7 wherein one of the error correcting code means is coupled to serially receive digital data for generating the associated parity bits and provides a block of digital data in an error correcting code format.

* * * * *